(12) United States Patent
Ndip et al.

(10) Patent No.: US 11,271,297 B2
(45) Date of Patent: Mar. 8, 2022

(54) THREE-DIMENSIONAL ANTENNA DEVICE

(71) Applicant: Fraunhofer-Gesellschaft zur Foerderung der angewandten Forschung e.V., Munich (DE)

(72) Inventors: Ivan Ndip, Berlin (DE); Christine Kallmayer, Berlin (DE); Klaus-Dieter Lang, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 326 days.

(21) Appl. No.: 16/672,884

(22) Filed: Nov. 4, 2019

(65) Prior Publication Data
US 2020/0144709 A1 May 7, 2020

(30) Foreign Application Priority Data
Nov. 6, 2018 (DE) .......................... 102018218894.7

(51) Int. Cl.
  *H03M 1/38* (2006.01)
  *H01Q 1/38* (2006.01)
  *H05K 1/02* (2006.01)
  *H01Q 1/22* (2006.01)
(52) U.S. Cl.
  CPC ............. *H01Q 1/38* (2013.01); *H01Q 1/2283* (2013.01); *H05K 1/0277* (2013.01)
(58) Field of Classification Search
  CPC ....... H01Q 1/38; H01Q 1/2283; H01Q 1/0277

USPC .......................................................... 343/907
See application file for complete search history.

(56) References Cited

U.S. PATENT DOCUMENTS

| | | | | |
|---|---|---|---|---|
| 4,816,836 A | * | 3/1989 | Lalezari | H01Q 21/065 156/215 |
| 5,668,563 A | * | 9/1997 | Ogino | H01Q 1/247 343/700 MS |
| 2002/0014996 A1 | * | 2/2002 | Keilen | H01Q 1/36 343/702 |
| 2010/0225542 A1 | * | 9/2010 | Suzuki | H01Q 1/243 343/700 MS |

FOREIGN PATENT DOCUMENTS

| | | |
|---|---|---|
| DE | 102008048289 | 3/2010 |
| WO | 2010031459 A1 | 3/2010 |

* cited by examiner

*Primary Examiner* — Peguy Jean Pierre
(74) *Attorney, Agent, or Firm* — Perkins Coie LLP; Michael A. Glenn

(57) ABSTRACT

The invention relates to an antenna device having an antenna structure and an antenna feed line feeding the antenna structure, and a three-dimensional shape structure having at least one portion on which the antenna structure is arranged. The antenna device additionally has a substrate extending in a substrate plane, the substrate having a first side and an opposite second side, and the three-dimensional shape structure being arranged on the first side of the substrate. The at least one portion of the three-dimensional shape structure protrudes from the substrate plane and is spaced apart from the substrate in a contactless manner so that the antenna structure arranged thereon is also spaced apart from the substrate spatially and in a contactless manner.

20 Claims, 16 Drawing Sheets

THREE-DIMENSIONAL ANTENNA DEVICE

CROSS-REFERENCE TO RELATED APPLICATION

This application claims priority from German Application No. 102018218894.7, which was filed on Nov. 6, 2018, is incorporated herein by reference in its entirety.

BACKGROUND OF THE INVENTION

The present invention relates to antenna devices and, in particular, to a three-dimensional antenna device comprising a fed antenna structure.

With higher frequencies, like, for example, in the millimeter wavelength range and higher, the radiation efficiency of planar antennas which are arranged directly on a substrate suffers severely from losses in connection with dielectrics used when manufacturing antennas. Dielectric losses and surface wave losses are among these. Three-dimensional antennas which are not arranged directly on a substrate exhibit an improved efficiency. However, with low frequencies, like, for example, in the lower GHz range, the antennas used here exhibit a, compared to the remaining circuit, very large and, thus, impractical length. With such length, some structures are unstable.

Antenna structures which can be operated at higher frequencies, in contrast, comprise very small dimensions. However, the effective useful bandwidth of such antennas, for example, GHz antennas, is restricted to a relatively narrow frequency band.

Consequently, it would be desirable to provide an antenna device for higher frequencies, comprising small dimensions, high stability and, at the same time, a high and effective useful bandwidth.

SUMMARY

According to an embodiment, an antenna device may have: an antenna structure and an antenna feed line feeding the antenna structure, a three-dimensional shape structure having at least one portion on which the antenna structure is arranged, and a substrate extending in a substrate plane, the substrate having a first side and an opposite second side, and the three-dimensional shape structure being arranged on the first side of the substrate, wherein the at least one portion of the three-dimensional shape structure protrudes from the substrate plane and is spaced apart from the substrate in a contactless manner so that the antenna structure arranged thereon is also spaced apart from the substrate spatially and in a contactless manner.

Another embodiment may have an electrical device having a multi-layered substrate having a high-frequency circuit, and an inventive antenna device as mentioned above, wherein the antenna device is arranged at the multi-layered substrate and is coupled to the high-frequency circuit, and wherein the antenna device is implemented to emit a high-frequency signal of the high-frequency circuit and/or receive a high-frequency signal and provide the same to the high-frequency circuit.

The inventive antenna device comprises a substrate and a three-dimensional shape structure. The three-dimensional shape structure comprises at least one portion where an antenna structure is arranged. The at least one portion of the three-dimensional shape structure protrudes from the substrate plane, without contacting the substrate. The antenna structure arranged on the at least one portion of the three-dimensional shape structure is thus spaced apart spatially from the substrate by means of the three-dimensional shape structure, without contacting the substrate. The three-dimensional shape structure thus has the effect of a kind of support structure for the antenna structure. This means that the antenna structure does not have to be self-supporting but can be arranged directly on the stable three-dimensional shape structure. Thus, the inventive antenna device exhibits a considerably increased stability when compared to conventional three-dimensional antennas. The antenna structure is an active radiator which is fed by means of an antenna feed line.

In accordance with an embodiment, the antenna structure can be a patch antenna. The substrate here can comprise a rear-side metallization which can be arranged on the second side of the substrate, i.e. on that side of the substrate facing away from the three-dimensional shape structure. Due to this three-dimensional configuration, the distance between the antenna structure and the rear-side metallization of the antenna structure is great, which means that the effective height of the antenna substrate is great. This allows considerably increasing the bandwidth of the inventive antenna device when compared to conventional three-dimensional antennas arranged directly on the substrate.

In accordance with another embodiment, an electrical device comprising a multi-layered substrate having a high-frequency circuit, and an inventive antenna device is suggested. The antenna device can be arranged at the multi-layered substrate and be coupled to the high-frequency circuit. The antenna device here can be implemented to emit a high-frequency signal of the high-frequency circuit and/or receive a high-frequency signal and provide the same to the high-frequency circuit.

BRIEF DESCRIPTION OF THE DRAWINGS

Embodiments of the present invention will be detailed below referring to the appended drawings, in which.

DETAILED DESCRIPTION OF THE INVENTION

Figure 1:
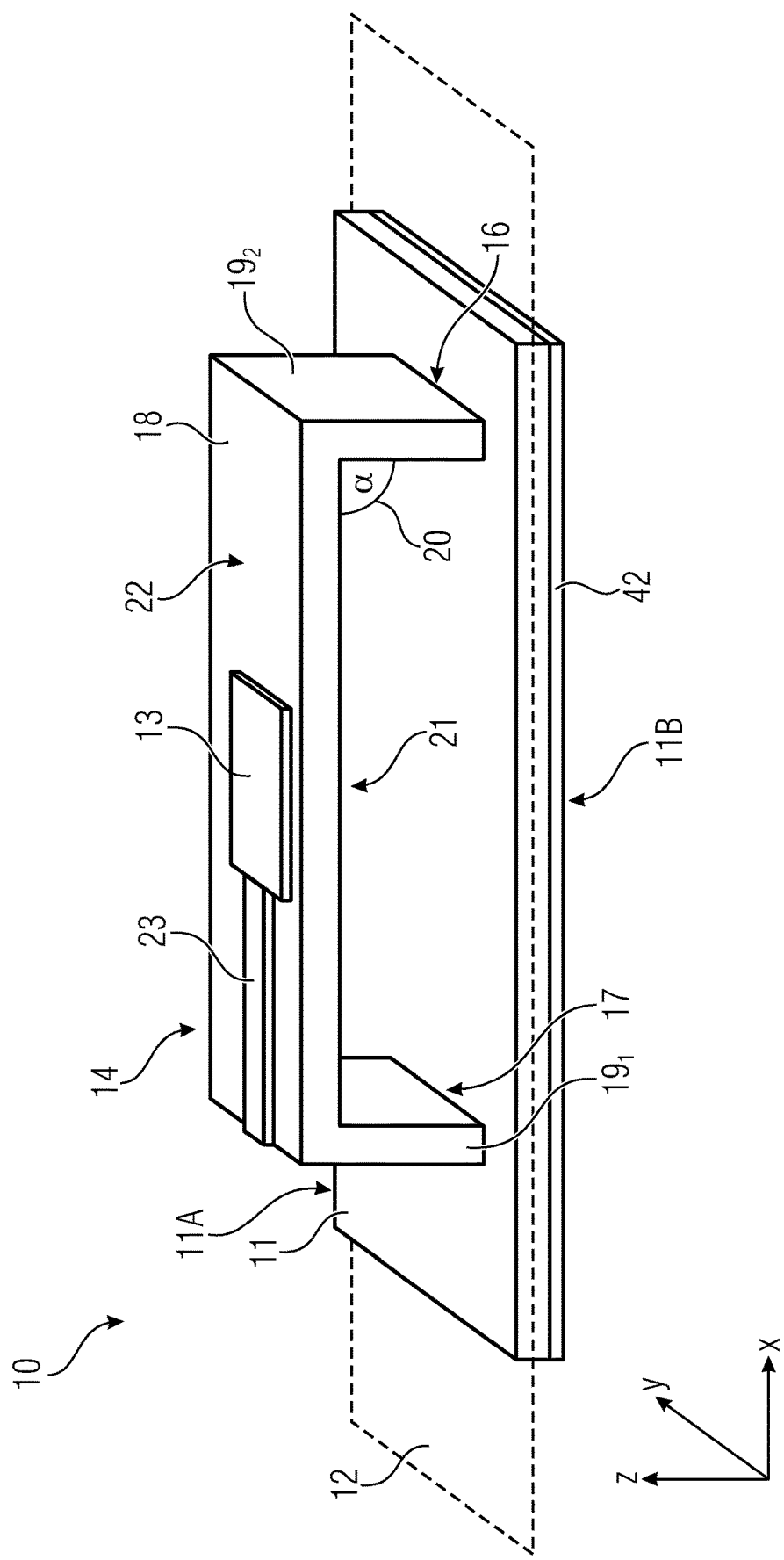
FIG. 1 is a schematic perspective view of an antenna device in accordance with an embodiment.

Embodiments will be described in greater detail below referring to the figures, wherein elements having the same or similar functions are provided with the same reference numerals.

At first, the antenna device is described as to its structure referring to the figures. What follows is a functional description of the antenna device.

The antenna structure will exemplarily be described below using a patch antenna. However, the type of the antenna structure is not restricted to this, i.e. the antenna structure may, for example, be a monopole, dipole, folded dipole, meandering radiator and the like.

In addition, the three-dimensional shape structure will be described here exemplarily using a convex curvature (facing away from the substrate) and angular three-dimensional shape structure. However, the geometrical shape of the three-dimensional shape structure is not restricted to this.

FIG. 1 shows an embodiment of an inventive antenna device 10. The antenna device 10 comprises a substrate 11. As is illustrated, the substrate 11 can exhibit a planar shape. Alternatively, the substrate 11 can comprise a geometrical shape deviating from the planar shape and can, for example, be implemented to be curved, kinked, arched or the like.

The substrate 11 extends in a two-dimensional substrate plane 12. With a planar substrate 11, the substrate plane 12 will correspondingly also be planar, as is illustrated in FIG. 1. In the case of a curved, kinked or arched substrate 11, for example, the substrate plane 12 would correspondingly also be curved, kinked or arched. Advantageously, the substrate 11 and the substrate plane 12 are implemented to be planar.

The two-dimensional substrate plane 12 may additionally extend in the center through the substrate 11 along the main extension direction of the substrate 11 and intersect the substrate 11 longitudinally, as is illustrated. Thus, the shape of the substrate plane 12 corresponds to the shape of the substrate 11, i.e. when the substrate 11 is, for example, arched, the substrate plane 12 extending through the center of the substrate 11 along the main extension direction of the substrate 11 may exhibit the same arching.

The substrate 11 comprises a first side 11A and an opposite second side 11B. A three-dimensional shape structure 14 is arranged on the first side 11A of the substrate 11. The three-dimensional shape structure 14 protrudes from the two-dimensional substrate plane 12. This means that the two-dimensional substrate plane 12 extends in a first and second direction (like x- and y-directions, for example) and the three-dimensional shape structure 14 additionally extends in a third direction (like z-direction).

The three-dimensional shape structure 14 comprises at least one portion 18 where an antenna structure 13 is arranged. The antenna structure 13 can be implemented as a patch antenna and comprise dimensions conventional for patch antennas, which makes the patch antenna 13 differ, with regard to both structure and function, from other antenna structures, like strip antennas, ribbon antennas, simple wire antennas and the like, for example. In these other antenna structures, the relation between length and width is such that the length is greater by a multiple than the width, i.e. L>>>B. For example, in these other antenna structures, the length can be greater than the width by at least ten times. In the exemplary patch antenna 13 illustrated here, however, the length can be smaller than the width by ten times. Exemplarily, the length of the patch antenna 13 can be five times the width or less. In other embodiments, the length of the patch antenna 13 can be double the width or less. In still other conceivable embodiments, the length and the width of the patch antenna 13 can be roughly equal.

The antenna structure 13 can be flexible. The antenna structure 13 can be conforming with the three-dimensional shape structure 14, i.e. the antenna structure 13 arranged at the three-dimensional shape structure 14 can take or have the same shape as does the three-dimensional shape structure 14, or the at least one portion 18 of the three-dimensional shape structure 14 where the antenna structure 13 is arranged.

This portion 18 is spaced apart spatially from the first side 11A of the substrate 11 in the third spatial direction mentioned above (like the z-direction). The portion 18 does not contact the first side 11A of the substrate 11. Thus, the antenna structure 13 arranged at the three-dimensional shape structure 14 is also spaced apart spatially from the substrate 11, without contacting the first side 11A of the substrate 11.

In the embodiment shown here, the three-dimensional shape structure 14 comprises an angular shape. Thus, the three-dimensional shape structure 14 can comprise a first portion 18 which is roughly parallel to the substrate 11, for example. In addition, the three-dimensional shape structure 14 can comprise two support structures 191, 192 which connect the first portion 18 to the substrate 11 and thus keep the first portion 18 spaced apart from the substrate 11. The support structures 191, 192 can extend at an angle 20 to the first portion 18 and/or extend perpendicularly to the substrate 11. In general, the angle 20 can, with both support structures 191, 192, be between 1° and 179°. In the embodiment shown here, the angle may, for example, be 90°. The angle will be described below in greater detail referring to FIG. 8.

An antenna feed line 23 which galvanically contacts the antenna structure 13 is also arranged on the portion 18. The antenna structure 13 can be fed by means of the antenna feed line 23 and emit a corresponding radio signal, or a radio signal received by means of the antenna structure 13 can be tapped using the feed line 23. The antenna feed line 23 also serves for electrical contacting or signal contacting of the antenna structure 13.

Advantageously, the antenna feed line 23 is planar and may be arranged directly on the three-dimensional shape structure 14. In addition, the antenna feed line 23 can also be arranged on the first side 11A of the substrate 11, and thus advantageously be planar, and advantageously directly on the first side 11A of the substrate. Since the antenna feed line 23 is implemented to be a strip line which is as thin as possible, the antenna feed line 23 itself does not have the effect of a radiator, but only the considerably wider antenna structure 13 acts as a radiator.

As has been mentioned above, the antenna structure 13 can, for example, be a patch antenna. On the second side 11B of the substrate 11, the antenna device 10 here can exemplarily comprise a metallization 42 which may also be referred to as rear-side metallization.

The metallization 42 can, for example, be a metal layer deposited on the second side 11B of the substrate 11. The metallization 42 can extend over the entire second side 11B of the substrate 11, optionally with the exception of a via or through contacting 39 (FIG. 3), or the metallization 42 can be arranged at least at a portion of the second side 11B of the substrate 11 which is arranged in a projection perpendicularly to the substrate plane 12 in the region of the patch antenna 13.

The three-dimensional shape structure 14 additionally comprises a first substrate contact portion 16 and a second substrate contact portion 17. This means that the three-dimensional shape structure 14 is physically in contact with the substrate 11 both at the first substrate contact portion 16 and the second substrate contact portion 17. In the embodiment shown, the two support structures 191, 192 of the three-dimensional shape structure 14 exemplarily comprise the substrate contact portions 16, 17 and, via these, are in physical contact with the substrate 11.

The three-dimensional shape structure 14 extends in three dimensions between the first substrate contact portion 16 and the second substrate contact portion 17. This means that the three-dimensional shape structure 14 extends longitudinally in parallel to the substrate plane 12 in a first and/or second directions (in the x- and/or y-directions, for example) and thus is spaced apart from the substrate 11 in a third direction (like the z-direction).

The three-dimensional shape structure 14 comprises a first side 21 which is arranged opposite the first side 11A of the substrate 11 and faces the same. The three-dimensional shape structure 14 additionally comprises a second side 22 arranged opposite the first side 21 which faces away from the first side 11A of the substrate 11. The antenna structure 13 is arranged on the second side 22 of the three-dimensional shape structure 14.

The antenna structure 13 in this embodiment extends in a plane in parallel to the substrate plane 12.

Figure 2:
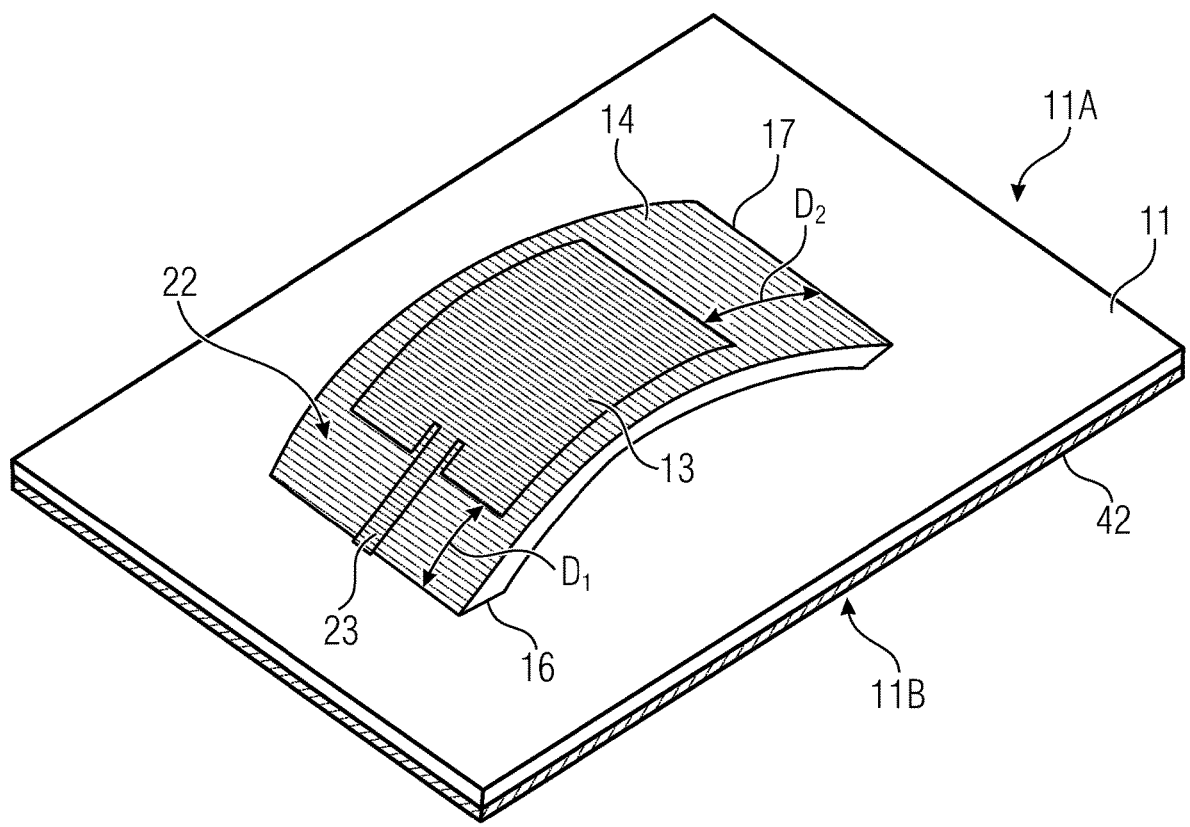
FIG. 2 is another schematic perspective view of an antenna device in accordance with an embodiment.
Figure 3:
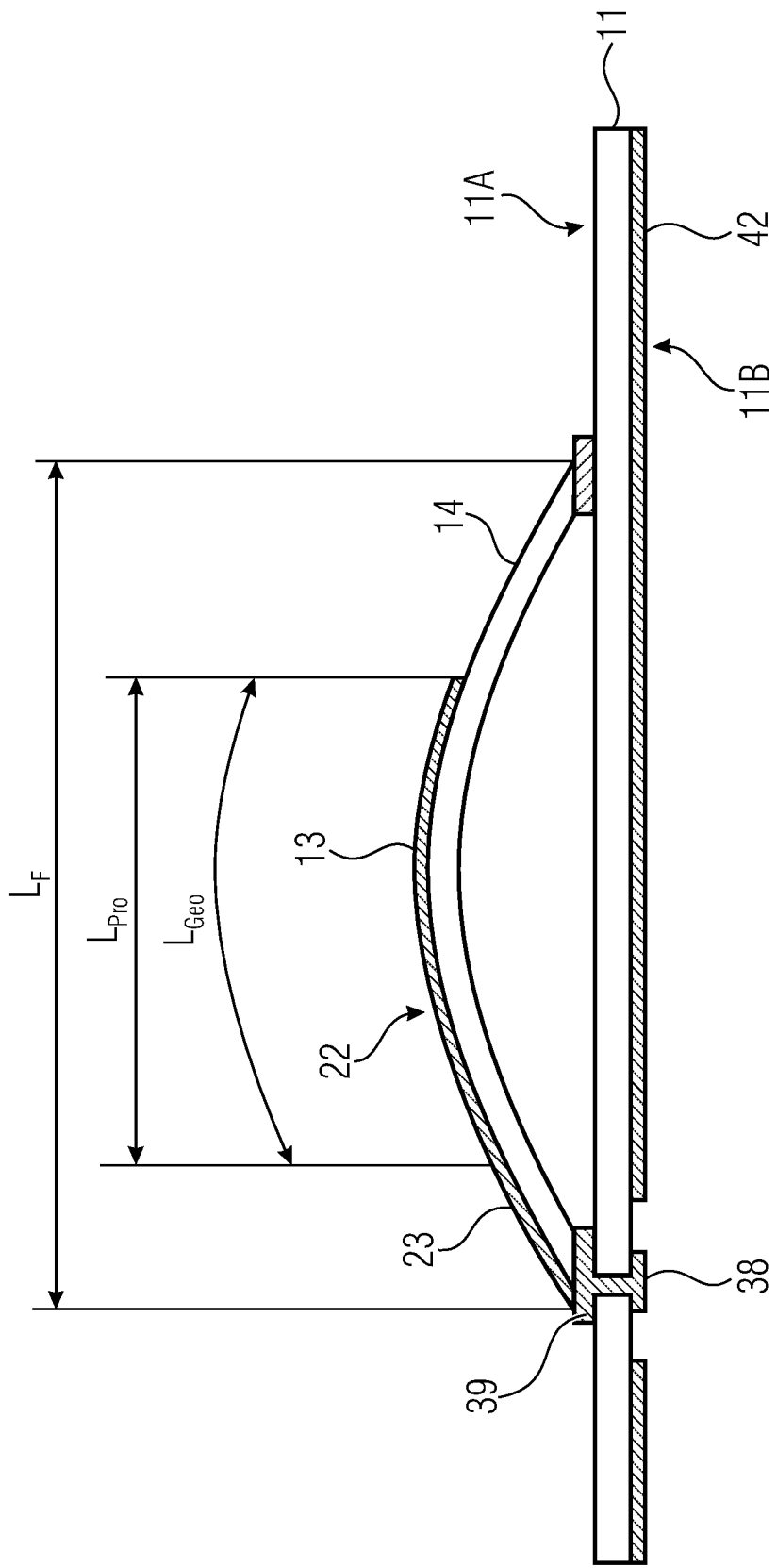
FIG. 3 is a schematic lateral view of an antenna device in accordance with an embodiment.

FIGS. 2 and 3 show another embodiment of an inventive antenna device 10. The antenna structure 13 here extends in a plane which is not parallel to the substrate plane 12.

In the embodiment shown in FIGS. 2 and 3, the three-dimensional shape structure 14 forms an arch extending across the first side 11A of the substrate 11 between the first substrate contact portion 16 and the second substrate contact portion 17. In this embodiment, the antenna structure 13 consequently extends in a plane which is curved relative to the substrate plane 12. However, it would also be conceivable for the plane to additionally, or as an alternative to the curvature, comprise at least one kink.

The antenna structure 13 is arranged on the three-dimensional shape structure 14 between the first substrate contact portion 16 and the second substrate contact portion 17. This means that the antenna structure 13 extends between the first substrate contact portion 16 and the second substrate contact portion 17. However, the antenna structure 13 does not contact the first side 11A of the substrate 11. The antenna structure 13 is thus spatially separated from the first substrate contact portion 16 and the second substrate contact portion 17 and, consequently, also from the first side 11A of the substrate 11. The antenna structure 13 here can also be separated galvanically from the first substrate contact portion 16 and the second substrate contact portion 17 and, consequently also from the first side 11A of the substrate 11.

The antenna structure 13 can be arranged in the center on the three-dimensional shape structure 14. This means that a first distance $D_1$ between the antenna structure 13 and the first substrate contact portion 16 can roughly be equal in size to a second distance D2 between the antenna structure 13 and the second substrate contact portion 17.

FIG. 3 shows a lateral view of the antenna device 10 having the arch-shaped three-dimensional shape structure 14. In this view, the geometries of the individual parts of the antenna device 10, which need not be to scale, can easily be recognized.

It can, for example, be seen that the antenna structure 13, in a projection perpendicularly to the substrate plane 12, can comprise a length $L_{Pro}$. The length $L_{Pro}$ in the projection perpendicularly to the substrate plane 12 is particularly meant when the antenna structure 13 comprises a shape deviating from the planar shape. This is, for example, the case when the antenna structure 13 is curved.

Otherwise, a geometrical length $L_{Geo}$ of the antenna structure 13 is used. This is the actual geometrical length of the antenna structure 13, irrespective of its shape. The geometrical length $L_{Geo}$ of the antenna structure 13 is exemplarily indicated in FIG. 3 for the curved shape of the antenna structure 13. With a planar antenna structure 13, as is exemplarily shown in FIG. 1, the geometrical length $L_{Geo}$ corresponds to the length $L_{Pro}$ in the projection perpendicularly to the substrate plane 12.

When mentioning the length L of the antenna structure 13, this length L can refer to both the length $L_{Pro}$ of the antenna structure 13 in a projection perpendicularly to the substrate plane 12, and to the geometrical length $L_{Geo}$ of the antenna structure 13. The same applies for a length of the three-dimensional shape structure 14 which can include a length $L_F$ in the projection perpendicularly to the substrate plane 12 or a geometrical length of the three-dimensional shape structure 14.

Thus, the length L of the antenna structure 13 can exemplarily be a half of or a quarter of the resonant wavelength of the antenna structure 13, i.e. $L=\lambda/2$ or $L=\lambda/4$.

The antenna structure 13 can have a length of 2.5 mm and a width of 2 mm, for example, and be particularly configured for a frequency range between 1 GHz and 1 THz.

The three-dimensional shape structure 14 can comprise a dielectric. Alternatively or additionally, the three-dimensional shape structure 14 can be produced from the same material as the substrate 11, wherein this material can also comprise a dielectric. Furthermore, alternatively or additionally, the three-dimensional shape structure 14 and the substrate 11 can be formed integrally, wherein the three-dimensional shape structure 14 and the substrate 11 can again comprise a dielectric. The three-dimensional shape structure 14 can thus isolate the antenna structure 13 galvanically from the first side 11A of the substrate 11.

As has been mentioned above, the antenna structure 13 comprises an antenna feed line 23. The antenna structure 13 can consequently be an active antenna. The antenna feed line 23 can, at least in portions, also be arranged on the three-dimensional shape structure 14, more precisely on the second side 22 of the three-dimensional shape structure 14 and contact the antenna structure 13. The antenna feed line 23 can be implemented as a strip line, which is as thin as possible, which can exemplarily be implemented in the form of a metallization on the three-dimensional shape structure 14.

As can be seen in FIG. 3, the antenna device 10 can comprise a via 39. The via 39, which is also referred to as through contacting, extends from the first side 11A of the substrate 11 to the second side 11B of the substrate 11 through the substrate 11. The metallization 42 on the second side 11B of the substrate 11 can comprise an interruption, like a recess, where a terminal 38 for contacting the via 39 can be arranged. The terminal 38 can thus contact the antenna structure 13 by means of the via 39 and, if applicable, a part of the antenna feed line 23 and at the same time be separated or isolated galvanically from the metallization 42. This means that the via 39 does not contact the metallization 42 arranged on the second side 11B of the substrate 11. Alternatively, it would also be conceivable for the via 39 to contact the metallization 42 galvanically. Connection could then take place along the entire metallization 42.

The antenna feed line 23 extends on the second side 22 of the three-dimensional shape structure 14, in a line as straight as possible, between the antenna structure 13 and the via 39 and thus connects the antenna structure 13 galvanically to the via 39 and to the terminal 38.

Figure 4:
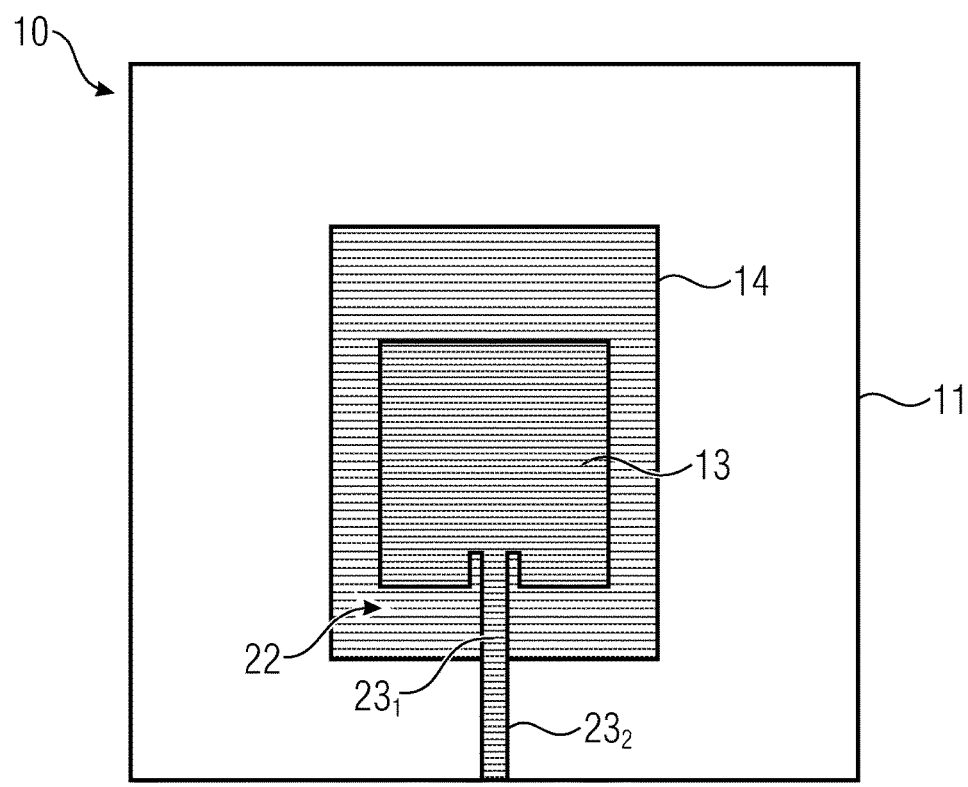
FIG. 4 is a schematic top view of an antenna device in accordance with an embodiment.
Figure 5:
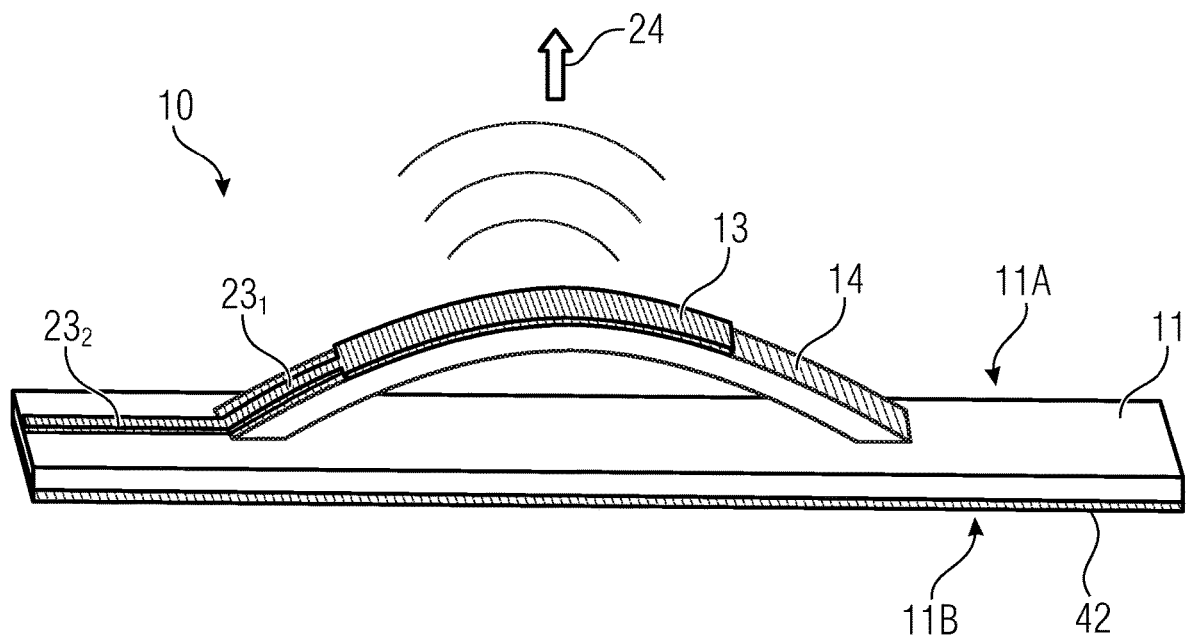
FIG. 5 is another schematic perspective view of an antenna device in accordance with an embodiment.

FIGS. 4 and 5 show an alternative implementation for a way of connecting the antenna structure 13. Here, the antenna feed line 23 comprises a first portion $23_1$ and a second portion $23_2$. The first portion $23_1$ of the antenna feed line 23 is, as described before relating to FIGS. 2 and 3, arranged on the second side 22 of the three-dimensional shape structure 14. The second portion $23_2$ of the antenna feed line 23 is arranged on the first side 11A of the substrate 11. The first portion $23_1$ and the second portion $23_2$ are formed to be contiguous. The second portion $23_2$ can be a strip line, as thin as possible, arranged on the first side 11A of the substrate 11, e.g. as a metallization.

The antenna structure 13 can comprise a preferential main direction of radiation 24. In this embodiment, the preferential main direction of radiation 24 is facing away from the substrate 11.

Figure 6:
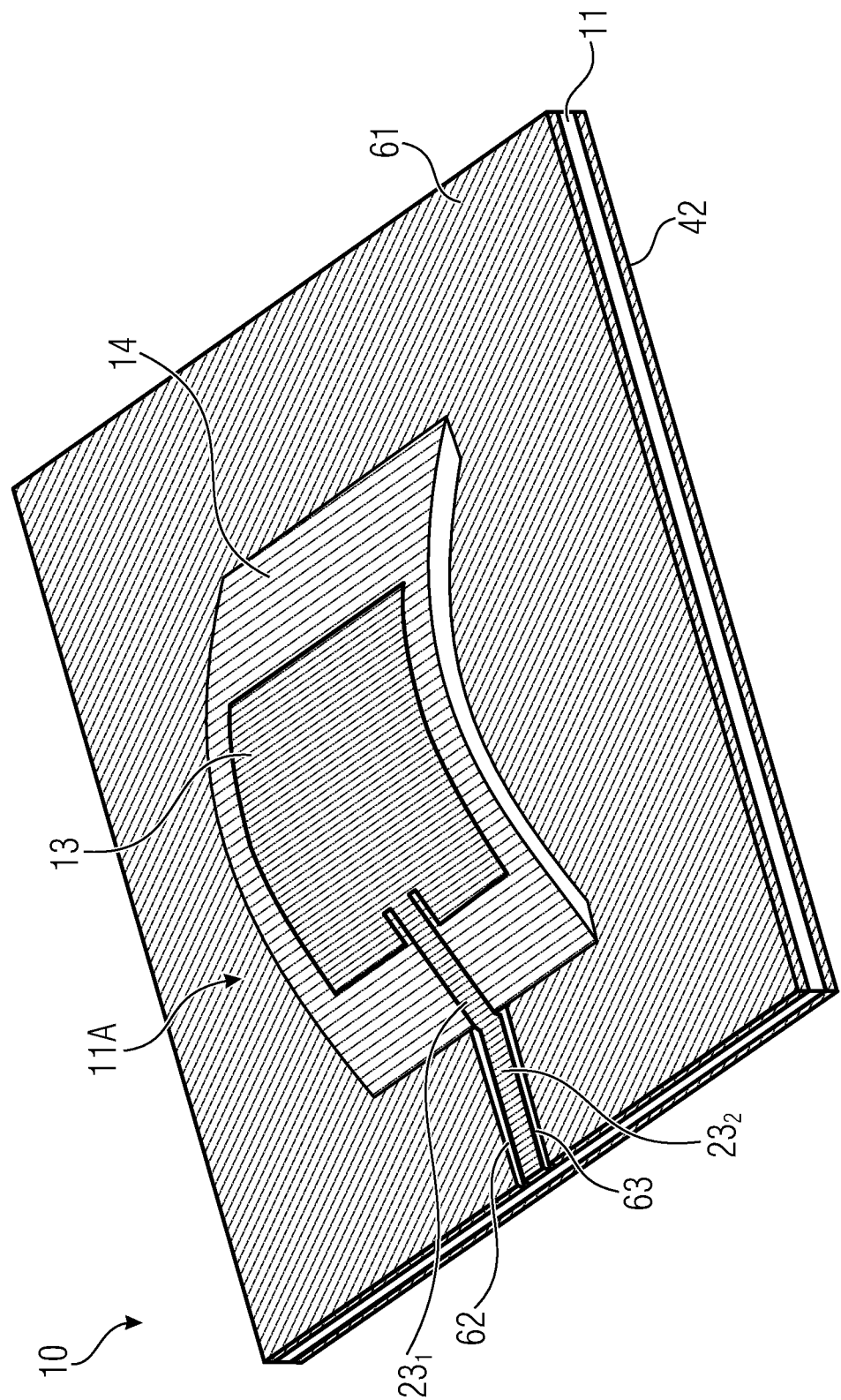
FIG. 6 is another schematic perspective view of an antenna device in accordance with an embodiment.

FIG. 6 shows another embodiment of an antenna device 10. This antenna device 10 differs from the antenna devices mentioned before in that, among other things, the first side 11A of the substrate 11 comprises a metallization sheet 61. The metallization sheet 61 is separated or isolated galvanically from the feed line 23. One or several non-conducting portions 62, 63 here can be provided in the metallization sheet 61, which are arranged between the antenna feed line 23 and the metallization sheet 61.

In FIG. 6, the antenna feed line 23 comprises a first portion $23_1$ arranged on the three-dimensional shape structure 14 and a second portion $23_2$ arranged on the first side 11A of the substrate 11. Alternatively or additionally, a combination of the metallization sheet 61 described here and a via 39 as described before referring to FIG. 3 would also be possible, wherein the via 39 could be separated or isolated galvanically from the metallization sheet 61.

The metallization sheet 61 can extend over the entire first side 11A of the substrate 11, except for a portion $23_2$ of the antenna feed line 23 which may be present and arranged on the first side 11A of the substrate, and/or a via, and except for the one or more non-conducting portions 62, 63 which may be present. In accordance with an embodiment, the metallization sheet 61 can correspondingly extend over at least 95% of the entire first side 11A of the substrate 11. In accordance with an alternative embodiment, the metallization sheet 61 can also extend only between the substrate 11 and the three-dimensional shape structure 14.

Figure 7:
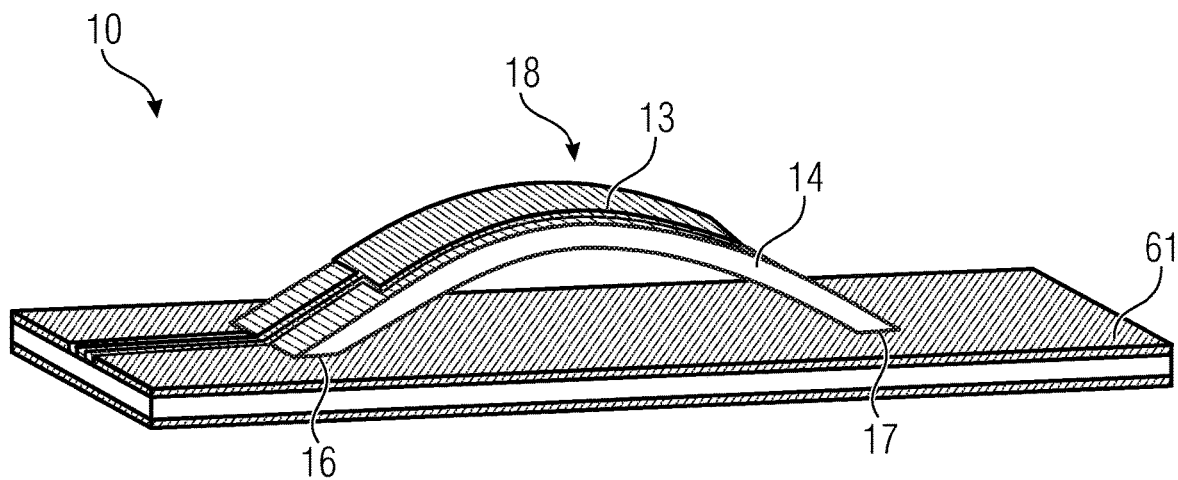
FIG. 7 is another schematic perspective view of an antenna device in accordance with an embodiment.

FIG. 7 shows a perspective lateral view of the antenna device 10 from FIG. 6. As can be recognized easily, the three-dimensional shape structure 14 can be arranged directly on the metallization sheet 61. More precisely, the first and second substrate contact portions 16, 17 can be arranged directly on the metallization sheet 61. The portion 18 of the three-dimensional shape structure 14 where the antenna structure 13 is arranged can be spaced apart spatially from the substrate 11 and from the metallization sheet 61, without contacting the first side 11A of the substrate 11. When the three-dimensional shape structure 14 comprises a dielectric, for example, the three-dimensional shape structure 14 can isolate the antenna structure 13 galvanically from the metallization sheet 61.

Figure 8:
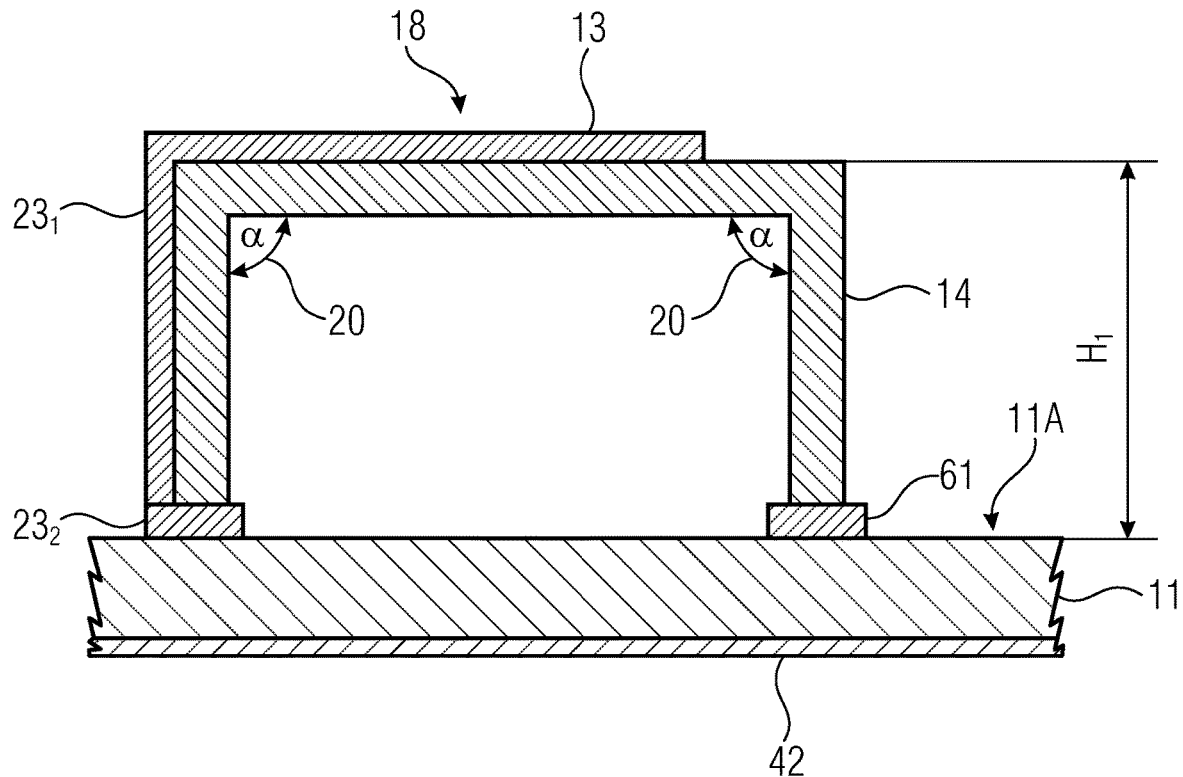
FIG. 8 is a schematic lateral sectional view of an antenna device in accordance with an embodiment.

FIG. 8 shows a schematic lateral sectional view of a part of an antenna device 10. In this view, the geometries of individual parts of the antenna device 10, which need not necessarily be to scale, can be recognized easily. FIG. 8 shows the three-dimensional shape structure 14 which comprises a portion 18 where the antenna structure 13 is arranged. In addition, the antenna feed line 23 can be recognized, which can comprise a first portion $23_1$ and a second portion $23_2$, wherein the second portion $23_2$ here is illustrated only in sections. The second portion $23_2$ can be a terminal pad. The first substrate side 11A can comprise a metallization sheet 61. The three-dimensional shape structure 14 can be arranged on the metallization sheet 61. The metallization sheet 61 can be a terminal pad.

The portion 18 of the three-dimensional shape structure 14 where the antenna structure 13 is arranged, is spaced apart from the first side 11A of the substrate 11. Thus, the antenna structure 13 arranged at the portion 18 is spaced apart from the first side 11A of the substrate 11 by a measure $H_1$. If the first side 11A of the substrate 11, as mentioned before, comprises a metallization sheet 61, the distance $H_1$ is defined between the metallization sheet 61 and the antenna structure 13. However, the metallization sheet 61 belongs to the first side 11A of the substrate 11.

The antenna structure 13 is spaced apart from the first side 11A of the substrate 11 in a non-contact manner by means of the three-dimensional shape structure 14 and separated or isolated galvanically from the first side 11A of the substrate 11 and/or from the metallization sheet 61 which may be present and/or from the substrate 11 itself and/or from the rear-side metallization 42. This means that this is not a loop antenna, i.e. a self-contained antenna.

Figure 9:
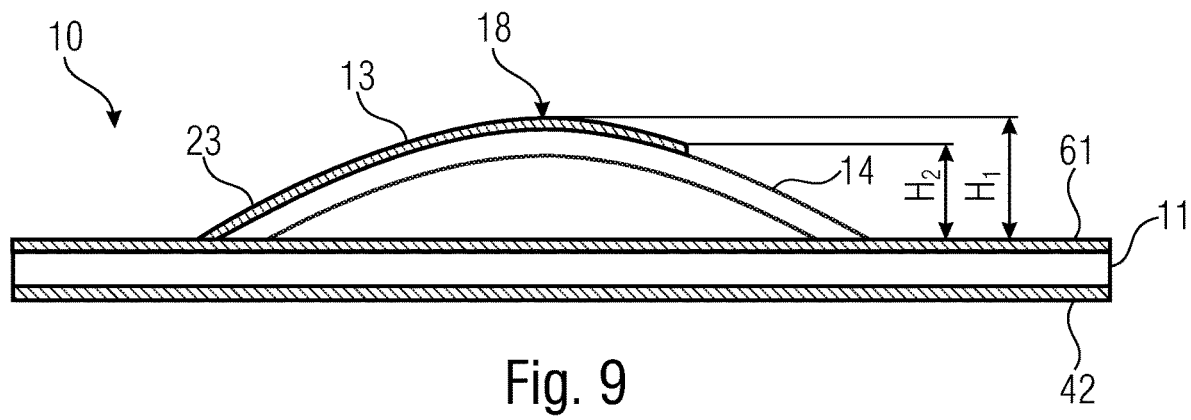
FIG. 9 is another schematic lateral view of an antenna device in accordance with an embodiment.

FIG. 9 shows a lateral view of an antenna device 10 having an arch-shaped three-dimensional shape structure 14 and conceivable spacings between the first side 11A of the substrate 11 and the antenna structure 13. In the arch-shaped implementation of the three-dimensional shape structure 14 shown, the spacing $H_1$ may, for example, be a spacing between the first side 11A of the substrate 11 and an upper vertex of the also arch-shaped antenna structure 13. The spacing $H_1$ may, for example, also be a maximum spacing between the first side 11A of the substrate 11 and the antenna structure 13, for example also in a three-dimensional shape structure 14 which is not arch-shaped, or with a different shape of the antenna structure 13 arranged thereon. With complex shaped three-dimensional shape structures 14, the spacing $H_1$ can, for example, be an average spacing between the first side 11A of the substrate 11 and the antenna structure 13.

The antenna device 10 can also comprise a second measure $H_2$ which defines a spacing between the first side 11A of the substrate 11 and the antenna structure 13. The second measure $H_2$ can be smaller than the first measure $H_1$, i.e. $H_2<H_1$. In the arch-shaped implementation of the three-dimensional shape structure 14 shown, the second spacing $H_2$ described before can, for example, be a spacing between the first side 11A of the substrate 11 and a lower vertex of the also arch-shaped antenna structure 13. The spacing $H_2$ may exemplarily also be a minimum spacing between the first side 11A of the substrate 11 and the antenna structure 13, for example also in a three-dimensional shape structure 14 which is not arch-shaped, or, for example, with a different shape of the antenna structure 13 arranged thereon.

Figure 10:
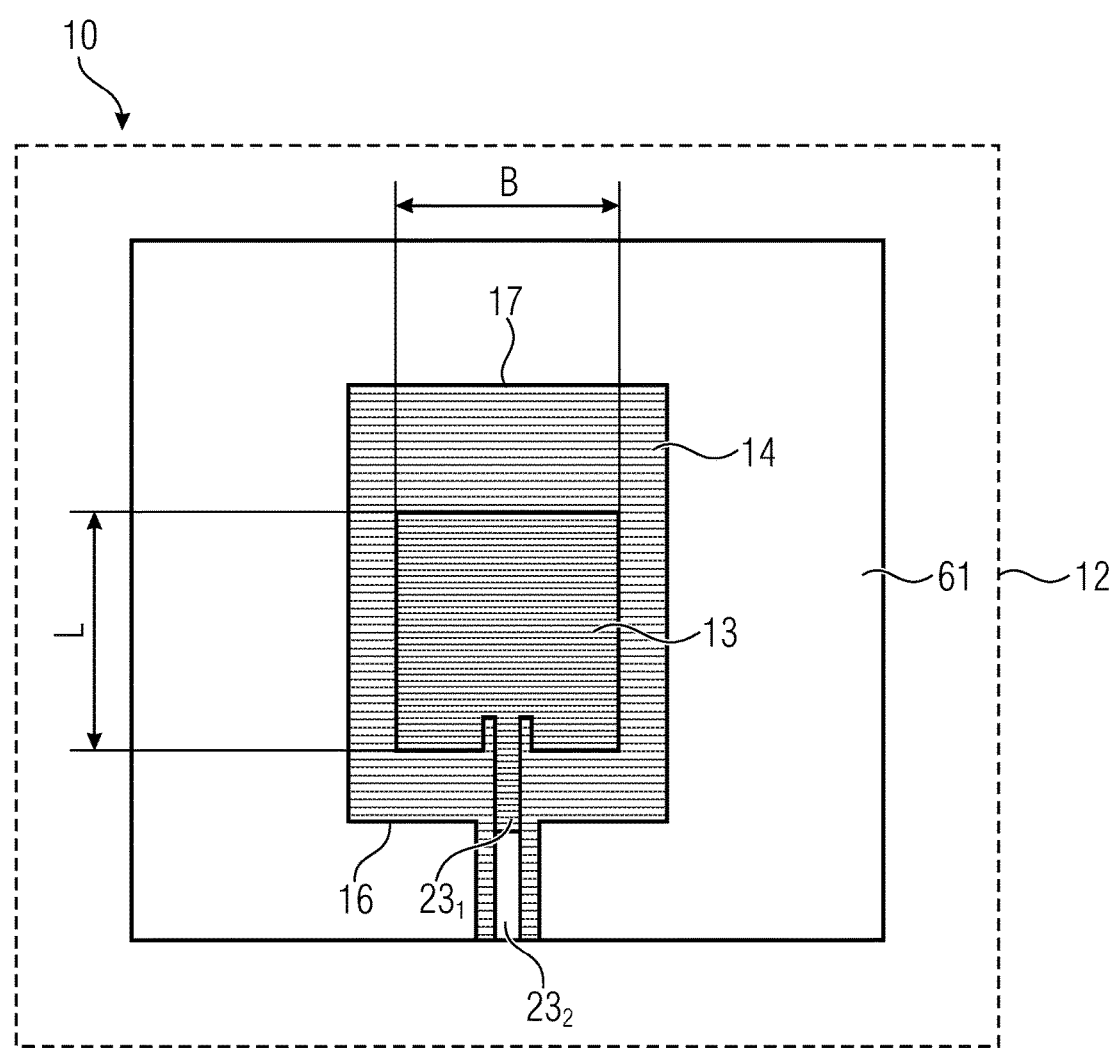
FIG. 10 is another schematic top view of an antenna device in accordance with an embodiment.

FIG. 10 shows a top view of the antenna device 10. The top view corresponds to a view of the antenna device 10 in a projection perpendicularly to the substrate plane 12.

The antenna structure 13 can, in this projection perpendicularly to the substrate plane 12, comprise a length L, which exemplarily roughly corresponds to the width B. This length can, for example, be a half of or a quarter of the resonant wavelength of the antenna structure 13. The length L here can be the longer one of the two directions of extension of the antenna structure 13, which particularly applies for the rectangular shape of the antenna structure 13 shown here. Additionally, the length L of the antenna structure 13 along the direction of extension of the three-dimensional shape structure 14 between the first and second substrate contact portions 16, 17 can be measured, which can apply, for example, with other geometrical shapes of the antenna structure 13.

In accordance with further embodiments, which are explicitly not illustrated here, the antenna structure 13 can, for example, be round or trapezoidal, or else comprise a different geometry. In addition, the antenna structure 13 can be patterned so as to generate a desired polarization, for example, or to generate single or multiple resonance, or to increase efficiency, gain and bandwidth.

Figure 11:
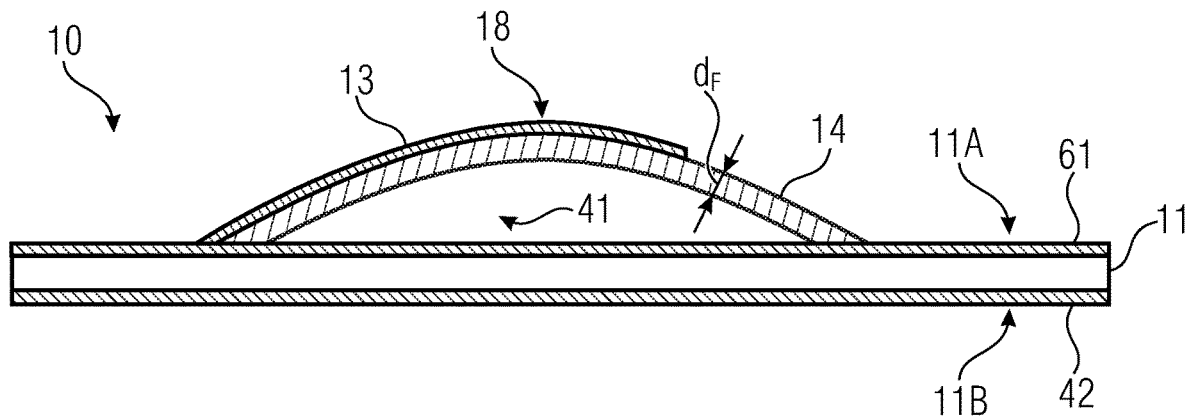
FIG. 11 is a schematic lateral view of an antenna device in accordance with an embodiment.
Figure 12:
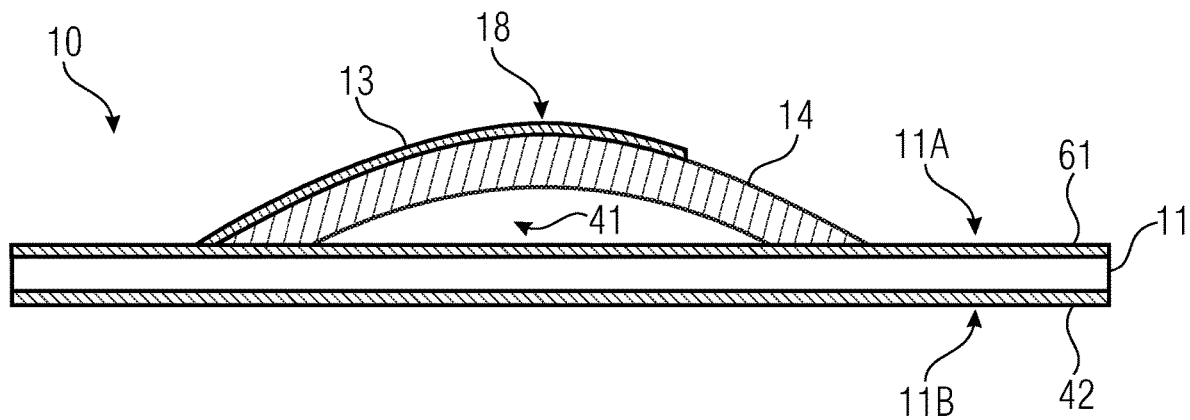
FIG. 12 is another schematic lateral view of an antenna device in accordance with an embodiment.
Figure 13:
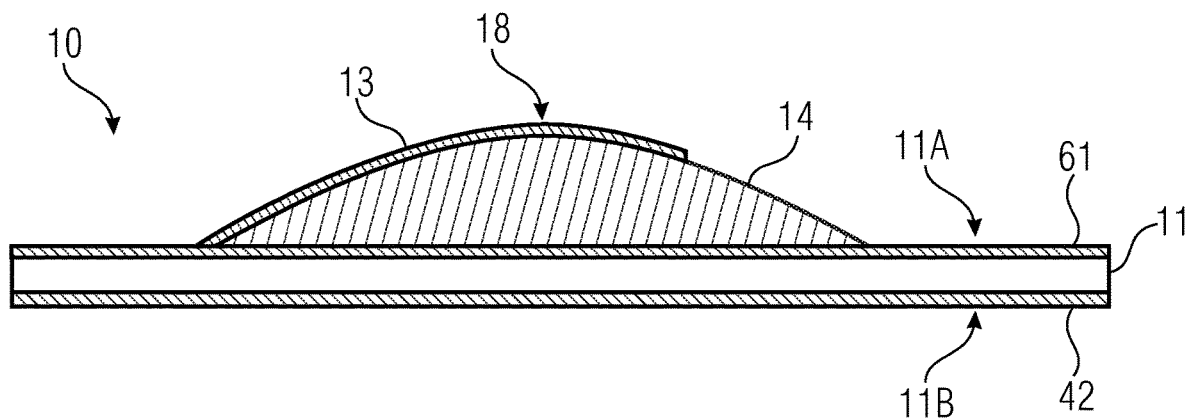
FIG. 13 is another schematic lateral view of an antenna device in accordance with an embodiment.

Further embodiments are shown in FIGS. 11, 12 and 13. It can be recognized here that the three-dimensional shape structure 14 spaced apart from the first side 11A of the substrate 11 comprises a gap 41 between the three-dimensional shape structure 14 and the first side 11A of the substrate. This gap 41 can comprise a dielectric.

In other words, at least the portion 18 of the three-dimensional shape structure 14 where the antenna structure 13 is arranged, is spaced apart from the first side 11a of the substrate 11 in a contact-free manner, thereby forming a gap 41 between the portion 18 of the three-dimensional shape structure 14 and the first side 11A of the substrate 11, and wherein the gap 41 can comprise a dielectric.

In the embodiment shown in FIG. 11, air is exemplarily provided as a dielectric between the three-dimensional shape structure 14, or the antenna structure 13, and the first side 11A of the substrate 11. Air as a dielectric is of particular advantage for the radiation behavior of the antenna structure 13. Thus, air as a dielectric between the antenna structure 13 and the first side 11A of the substrate 11 is of advantage. In principle, the dielectric arranged in the gap 41 may, however, also be any other dielectric than air.

It would, for example, be conceivable for the three-dimensional shape structure 14 itself to comprise a dielectric, or be manufactured from a dielectric, wherein the three-dimensional shape structure 14 may protrude further into the gap 41 than is illustrated in FIG. 11.

Such embodiments are shown in FIGS. 11, 12 and 13, wherein the embodiment shown in FIG. 11 basically corresponds to the embodiments shown in FIGS. 3 and 9. The thickness dF of the three-dimensional shape structure 14 can, for example, be between 20 µm and 100 µm, or between 20 µm and 60 µm and, for example, roughly 50 µm or greater than 100 µm.

The three-dimensional shape structure 14 can exemplarily protrude into the gap 41 up to half thereof. The three-dimensional shape structure 14 here fills roughly one half of the gap 41. Such an embodiment is shown in FIG. 12. The three-dimensional shape structure 14 can protrude further into the gap 41 and thus fill up to roughly three quarters of the gap 41.

However, it would also be conceivable for the three-dimensional shape structure 14 to completely fill the gap 41. Thus, the three-dimensional shape structure 41 can contact the first side 11A of the substrate 11. The first side 11A of the substrate can, as has been described before, comprise a metallization sheet 61. In this case, the three-dimensional shape structure 14 can contact the metallization sheet 61. Such an embodiment is shown in FIG. 13.

When the three-dimensional shape structure 14 comprises a dielectric, the three-dimensional shape structure 14 can galvanically isolate the antenna structure 13 from the metallization sheet 61.

Figure 14:
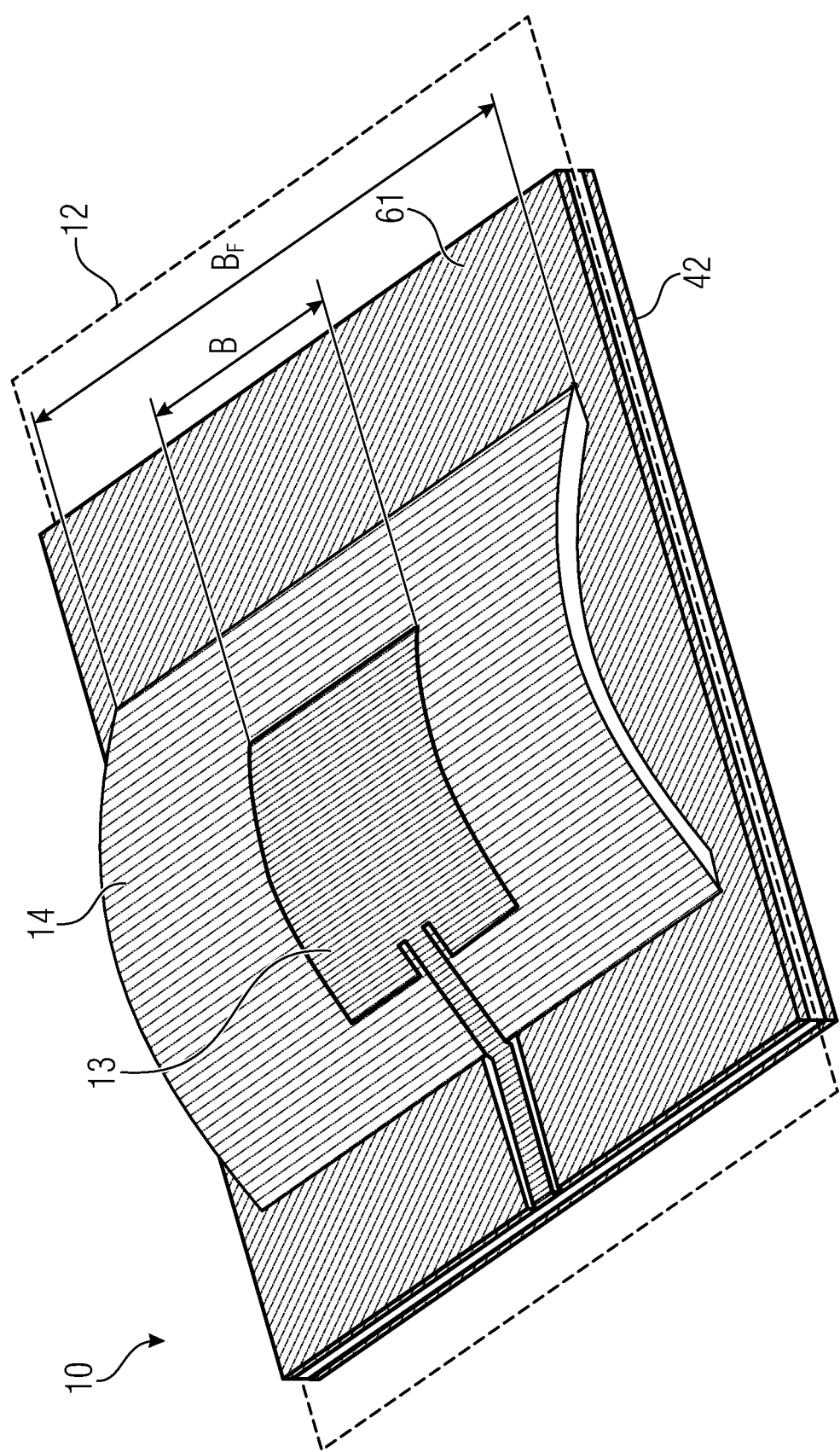
FIG. 14 is a schematic perspective view of an antenna device in accordance with an embodiment.
Figure 15:
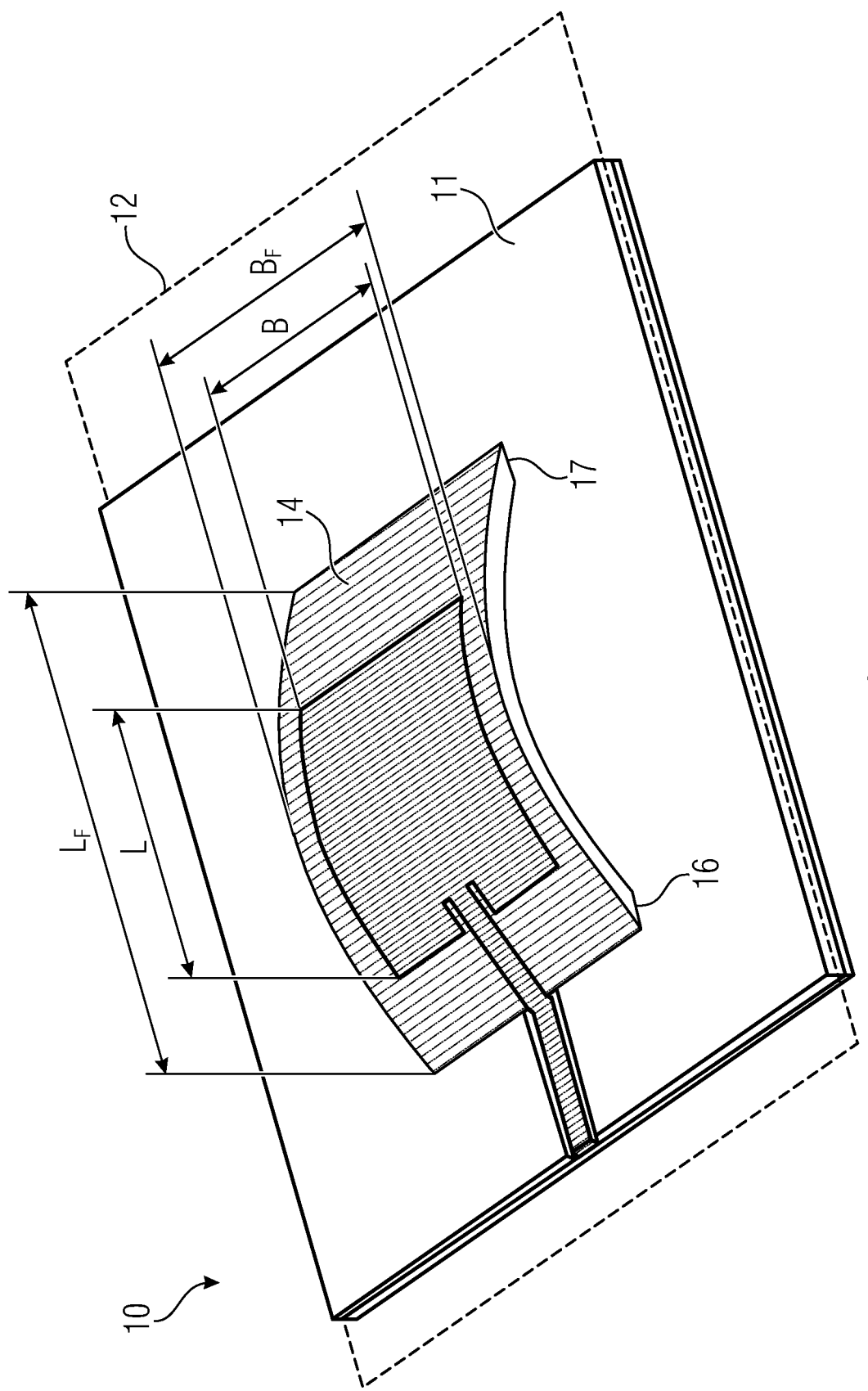
FIG. 15 is another schematic perspective view of an antenna device in accordance with an embodiment.

FIGS. 14 and 15 show further embodiments of an antenna device 10. In FIG. 14, the antenna structure 13 comprises a width B and the three-dimensional shape structure 14 comprises a width BF. Generally, the three-dimensional shape structure 14 can be wider than the antenna structure 13 arranged thereon. In the embodiment shown here, the width BF of the three-dimensional shape structure 14 is roughly three times the size of the width B of the antenna structure 13. However, it is also conceivable for the width BF of the three-dimensional shape structure 14 to be roughly four times the size of the width B of the antenna structure 13, or for the width BF of the three-dimensional shape structure 14 to be roughly double the size of the width B of the antenna structure 13. The antenna structure 13 here can be arranged symmetrically at the three-dimensional shape structure 14, wherein, in the width direction, the antenna structure 13 is spaced apart equally from both ends of the three-dimensional shape structure 14, as is also shown in FIG. 14.

FIG. 15 shows another embodiment. Here, the three-dimensional shape structure 14 is roughly as wide as the antenna structure 13. This means that the width BF of the three-dimensional shape structure 14 can equal the size of the width B of the antenna structure 13. The width BF of the three-dimensional shape structure 14, however, can also be greater than the width B of the antenna structure 13 by up to 10% or by up to 20%.

In a projection perpendicularly to the substrate plane 12, a length L of the antenna structure 13 may roughly be a half of or a quarter of the length $L_F$ of the three-dimensional shape structure 14.

Figure 16:
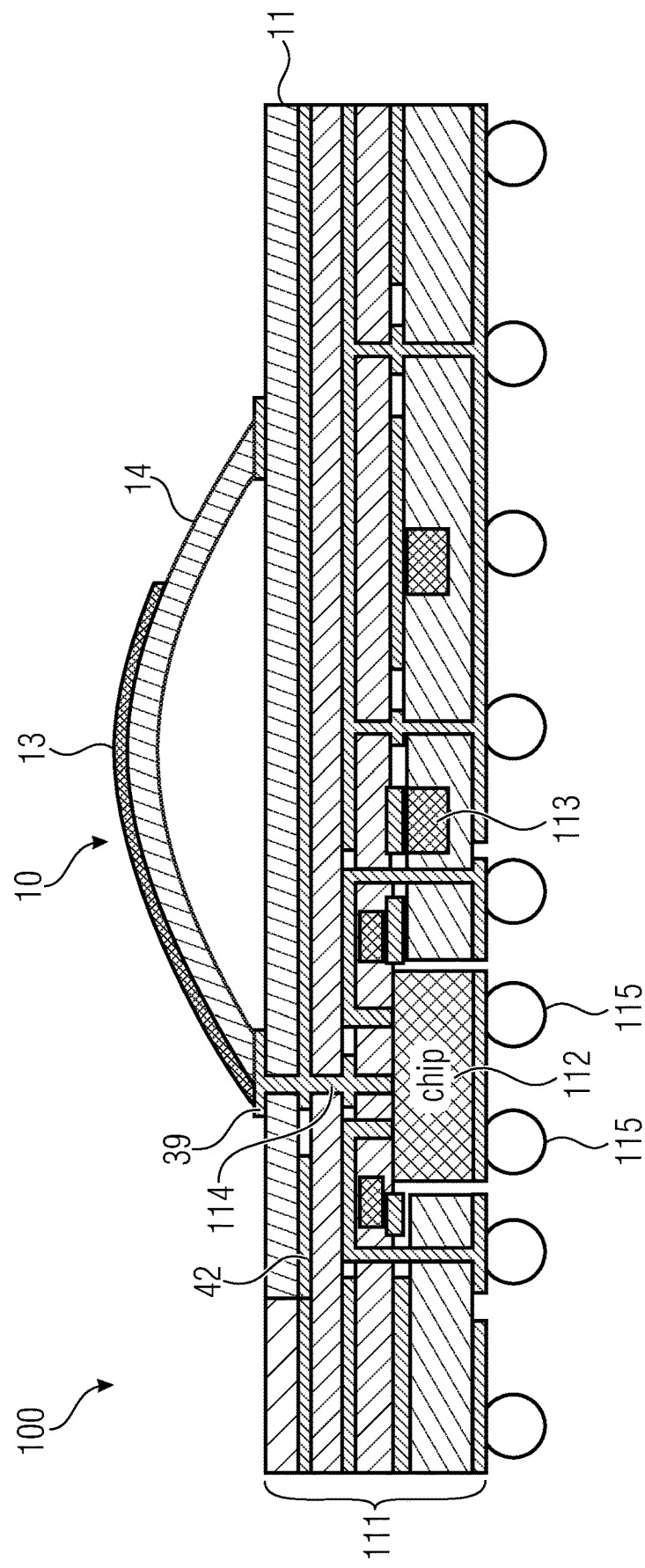
FIG. 16 is a schematic lateral sectional view of an electrical device comprising an antenna device in accordance with an embodiment.
Figure 17:
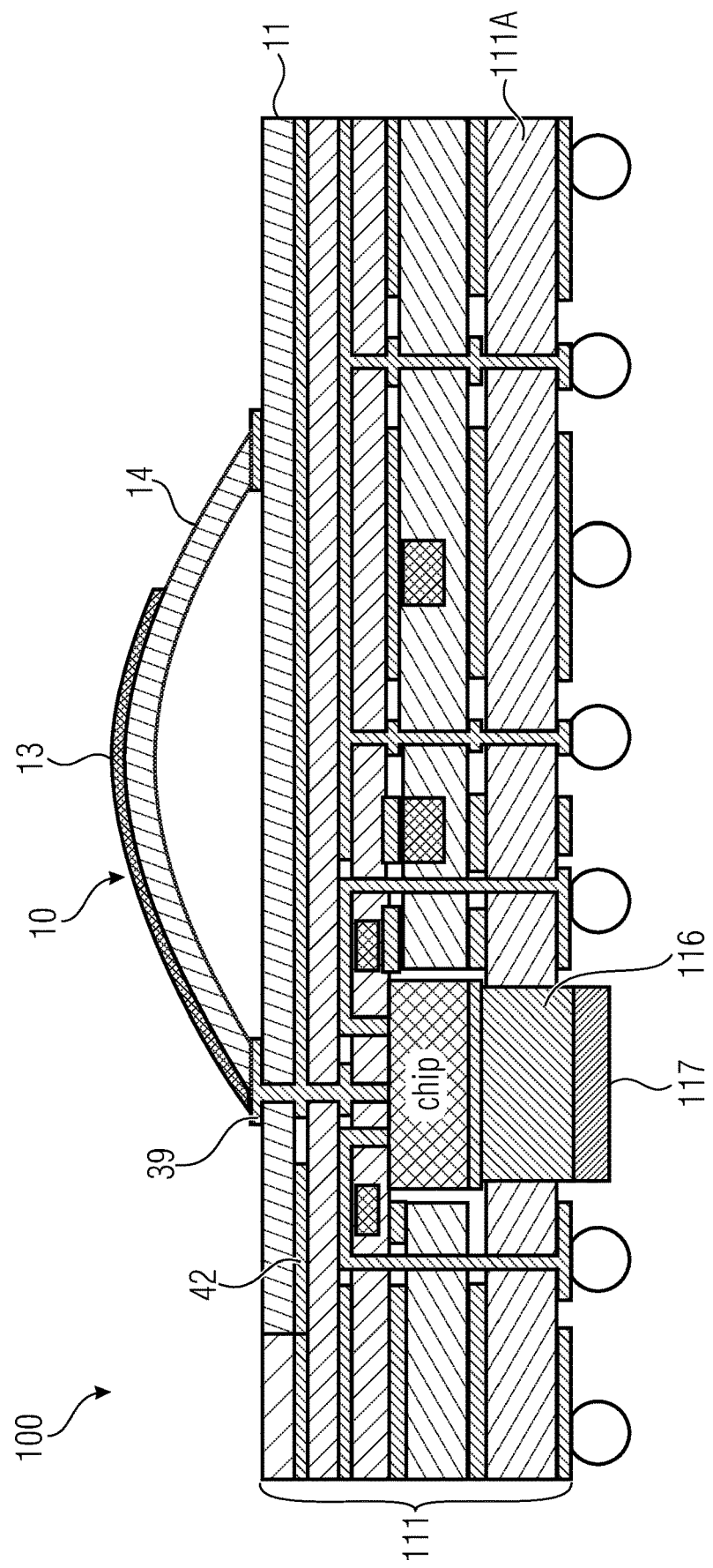
FIG. 17 is another schematic lateral sectional view of an electrical device comprising an antenna device in accordance with an embodiment.
Figure 18:
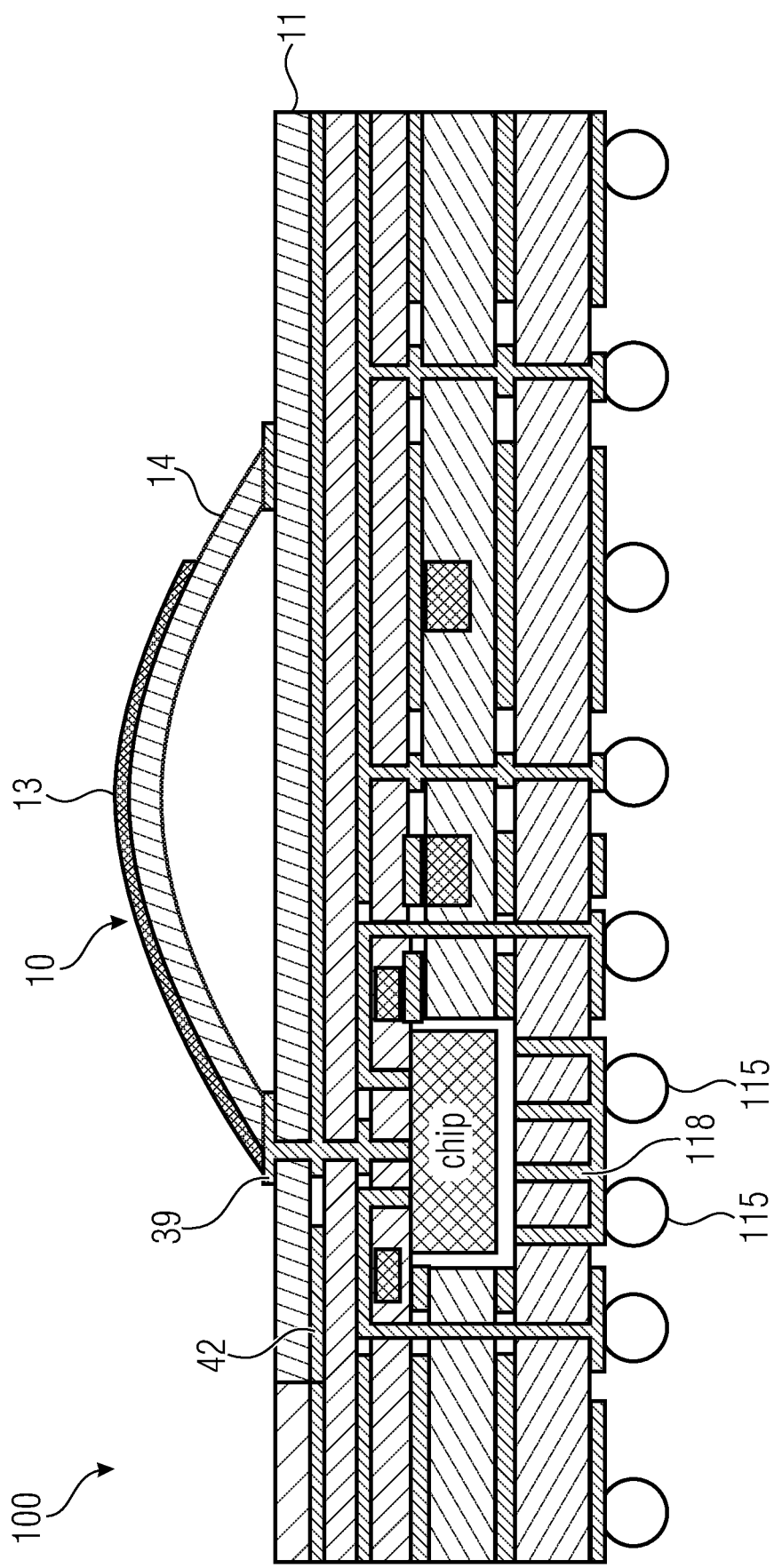
FIG. 18 is another schematic lateral sectional view of an electrical device comprising an antenna device in accordance with an embodiment.

FIGS. 16 to 18 show an electrical device 100 comprising the antenna device 10 described herein. The electrical device 100 comprises a substrate 110 having a multi-layered circuit structure. This may, for example, be a circuit board-based substrate having an integrated chip. The substrate 111 can exemplarily be a printed circuit board. The substrate 110 can comprise one or several layers or sheets.

The substrate 111 can comprise at least one embedded or integrated circuit component 113. Alternatively or additionally, the substrate 111 can comprise at least one high-frequency circuit, for example a high-frequency chip 112, which can be embedded or integrated in the substrate 111.

The antenna device 10 is arranged at the substrate 111. The antenna device 10 can exemplarily be arranged directly, with its rear-side metallization 42, at the substrate 111 and additionally be coupled mechanically to the substrate 111 and electrically to the one or more circuit components 113 and, in particular, to the high-frequency chip 112. Thus, it is of particular advantage for the substrate 111 of the antenna device 10 to have a planar implementation and for the rear-side metallization 42 arranged on the second side 11B of the substrate 11 also to be of a planar implementation. Thus, the antenna device 10 can easily be arranged on a top layer of conventional packages or system boards and be integrated in a conventional high-frequency circuit. This easy integration of the antenna device 10 in existing HF packages is a particular advantage of the present invention. Additionally, it is conceivable for the rear-side metallization 42 to provide shielding from radiation emitted by the antenna structure 13. Thus, the high-frequency chip 112 could be shielded suitably from electromagnetic waves, thereby considerably increasing the electromagnetic compatibility (EMC) of the electrical device 100.

In addition, the antenna device 10 can be connected electrically to the high-frequency chip 112. This may exemplarily be done by means of the via (through contacting) 39 described before and, optionally, by means of a further via 114 provided in the substrate 111, thereby making the high-frequency chip 112 electrically couplable to the antenna feed line 23 and/or, directly, to the antenna structure 13. The antenna device 10 is implemented to emit a high-frequency signal of the high-frequency chip 112 and/or receive a high-frequency signal and provide same to the high-frequency chip 112 for further processing. However, it would also be conceivable for the second portion $23_2$ of the antenna feed line 23, as is exemplarily illustrated in FIGS. 4 and 4, to be present and contacted, instead of the via 39.

For contacting the electric device 100 on another substrate (which is not explicitly illustrated here), contacting elements, like solder balls 115, could be provided.

For thermally decoupling the high-frequency chip 112, these solder balls 115 can be arranged at the high-frequency chip 112. The solder balls 115 comprise high a heat conductance value so as to dissipate heat forming from the high-frequency chip 112.

Figure 19:
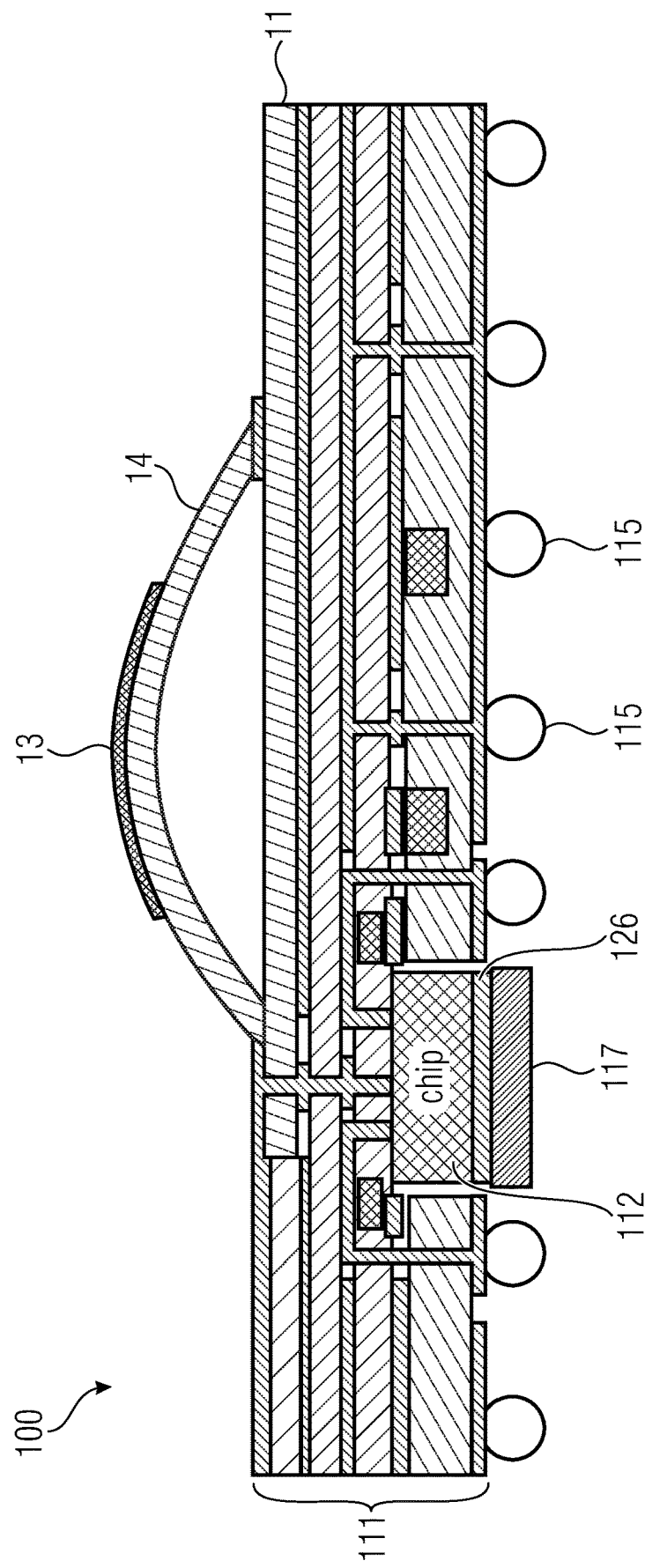
FIG. 19 is a schematic lateral sectional view of an electrical device comprising an antenna device in accordance with an embodiment.

FIG. 19 shows an alternative, to FIG. 16, way of dissipating heat by using a heat sink 117. The heat sink 117 can be connected to the high-frequency chip 112 by means of conductive glue 126.

Another way of thermal decoupling, which can be used as an alternative or additionally, is shown in FIG. 17. When compared to FIG. 16, in addition or as an alternative to the solder balls 115, a heat conductance element 116 having high a heat conductance value, like a metal block, can be provided. When compared to FIG. 16, the substrate 111 can exemplarily comprise an additional substrate layer 111A where the heat conductance element 116 can be arranged. Optionally, a heat sink 117 can be provided additionally. This may exemplarily be solder balls 115 and/or a material absorbing heat, like a thermally conductive paste. The heat sink 117 can be arranged at the lower side of the heat conductance element 116 so that the heat conductance element 116 is arranged between the high-frequency chip 112 and the heat sink 117. The heat sink 117 can be arranged on another substrate (which is not explicitly illustrated here). The heat conductance element 116 can alternatively, completely or partly, be implemented as a glue material, wherein different materials could be used here, like curing glue and/or thermally conductive pastes.

A further alternative for thermal decoupling is illustrated in FIG. 18. When compared to FIG. 17, in addition or as an alternative to the heat conductance element 116, at least one thermal via 118 can be provided. This via 118 can basically serve the same purpose as the heat conductance element 116. The via 118 can be coupled by means of solder balls 115 and/or by means of a heat sink (which is not illustrated here), comparable to the heat sink 117 illustrated in FIG. 17.

In accordance with further embodiments, which are not illustrated here explicitly, at least two of the antenna devices 10 described herein can be united to form an antenna array.

Figure 20A:
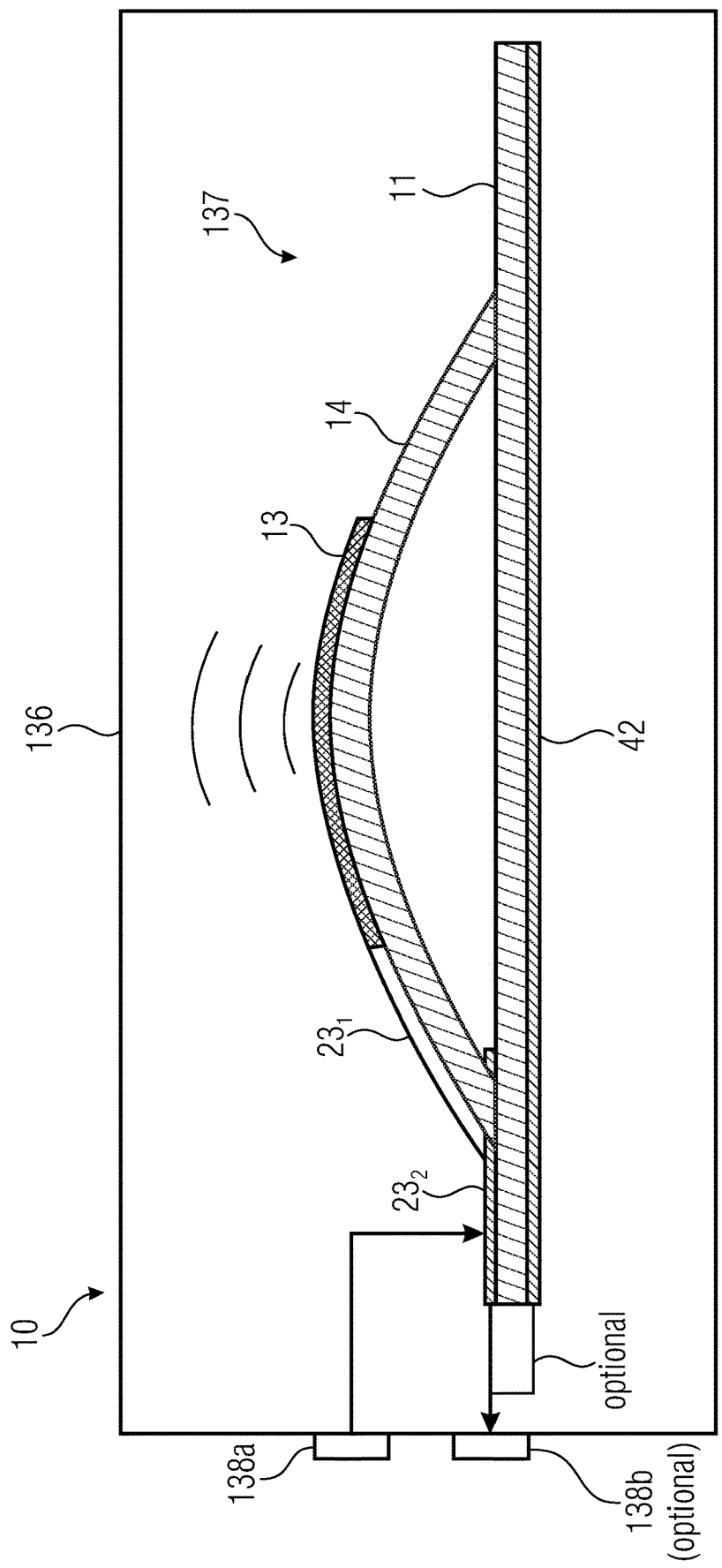
FIG. 20A is a schematic lateral sectional view of an antenna device comprising a housing in accordance with an embodiment.

FIG. 20A shows a schematic lateral sectional view of an antenna device 10 in accordance with an embodiment, comprising a housing 136. The housing 136 is formed to comprise, at least in parts, a dielectric or electrically insulating material so as to allow the emission of a radio signal from the housing 136. Exemplarily, the housing 136 can comprise a plastic material or glass material. A plastic material can be arranged while dicing and encapsulating the antenna device 10 from a wafer. The antenna device 10 can be arranged within the housing 136. Alternatively or additionally, another antenna device in accordance with embodiments described here, at least one antenna array and/or at least one electrical device 100 in accordance with embodiments described herein can be arranged within the housing 136. An internal volume 137 of the housing 136 can be filled, at least partly, with a gas, like air or a material having low a dielectric constant, or a material resulting in small a loss in performance.

The housing 136 comprises a terminal 138a which can be connected to the antenna feed line 23. The terminal 138a is configured to be connected to a signal output of a high-frequency chip 112 (see, for example, FIGS. 16 to 18). This means that a high-frequency signal can be received via the terminal 138a, for example. The housing 136 can comprise another terminal 138b which can be connected to the antenna feed line 23 as a return line or, optionally, to the rear-side metallization 42. Exemplarily, the terminal 138b is connected to an electrical line configured as a return line which can be implemented by the antenna feed line 23 or can be implemented by the rear-side metallization 42.

Figure 20B:
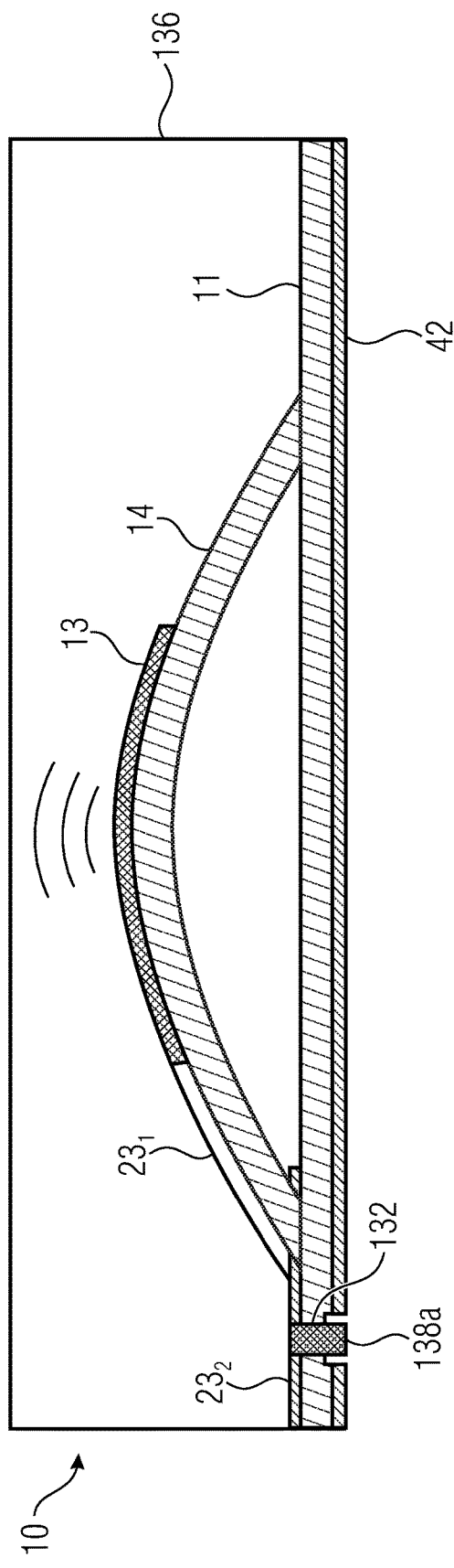
FIG. 20B is another schematic lateral sectional view of an antenna device comprising a housing in accordance with an embodiment.

FIG. 20B shows a schematic lateral sectional view of an antenna device 10 in accordance with another embodiment which comprises a housing, and wherein the rear-side metallization 42 is connected to a wall of the housing 136 or forms the wall so as to easily allow contacting between the rear-side metallization 42 and other components. The terminal 138a can be connected to an electrically conductive structure 132, like a via, for example. The terminal 138a can serve for providing a vertical connection to the antenna device 10, like the antenna feed line 23, so as to excite the antenna device 10. Thus, the terminal 138a can provide a contact to the environment of the antenna device 10.

Figure 20C:
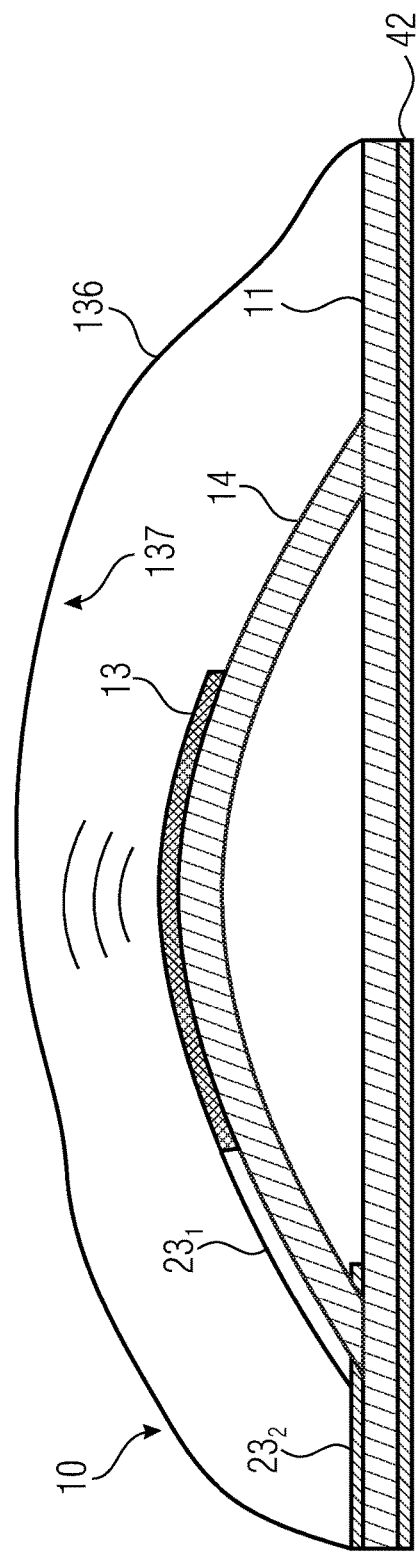
FIG. 20C is another schematic lateral sectional view of an antenna device comprising a housing in accordance with an embodiment.

FIG. 20C shows a schematic lateral sectional view of an antenna device 10 in accordance with another embodiment in which the housing 136, when compared to FIG. 20B, is implemented as a lens configured to influence a radiation characteristic of the radio signal. Exemplarily, the lens can be implemented to collimate the radio signal. The interior space 137 of the housing 136 can, for example, be filled at least partly with a dielectric material and an external shape of the housing 136 can comprise a concave or convex shape so as to obtain a scattering or collimating lens function.

The antenna structure 13 can be implemented as an active antenna which is fed by the antenna feed line 23. The antenna structure 13 radiates in a preferential main direction of radiation 24. This main direction of radiation 24 is directed away from the substrate 11.

Radiation parts emitted by the antenna structure 13 in the opposite direction, i.e. in the direction towards the substrate 11, can be reflected or absorbed by means of the rear-side metallization 42.

Due to the three-dimensional configuration, the distance between 13 (radiator) and 42 (rear-side metallization) of the antenna is great, i.e. the effective height of the antenna substrate is great. This allows increasing enormously the bandwidth of the inventive antenna device 10 when compared to conventional three-dimensional antennas which are located directly on the substrate.

The inventive antenna device 10 can advantageously be operated in frequency ranges between 1 GHz and 1 THz, for example.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An antenna device comprising:
an antenna structure and an antenna feed line feeding the antenna structure,
a three-dimensional shape structure comprising at least one portion on which the antenna structure is arranged, and
a substrate extending in a substrate plane, the substrate comprising a first side and an opposite second side, and the three-dimensional shape structure being arranged on the first side of the substrate,
wherein the at least one portion of the three-dimensional shape structure protrudes from the substrate plane and is spaced apart from the substrate in a contactless manner so that the antenna structure arranged thereon is also spaced apart from the substrate spatially and in a contactless manner.

2. The antenna device in accordance with claim 1, wherein the second side of the substrate comprises a metallization, and wherein the antenna structure is a patch antenna.

3. The antenna device in accordance with claim 2, wherein the antenna feed line is arranged on the three-dimensional shape structure and connects the antenna structure galvanically to a via arranged on the first side of the substrate, the via extending from the first side of the substrate to the second side of the substrate, without contacting the metallization arranged on the second side of the substrate.

4. The antenna device in accordance with claim 1, wherein the three-dimensional shape structure comprises a first side which is arranged opposite the first side of the substrate and faces the same, and wherein the three-dimensional shape structure comprises a second side arranged opposite the first side, which faces away from the first side of the substrate, wherein the antenna structure is arranged on the second side of the three-dimensional shape structure.

5. The antenna device in accordance with claim 1, wherein the three-dimensional shape structure comprises a first substrate contact portion and a second substrate contact portion, and wherein the at least one portion of the three-dimensional shape structure extends between the first substrate contact portion and the second substrate contact portion so as to be spaced apart from the substrate.

6. The antenna device in accordance with claim 5, wherein the antenna structure is arranged on the three-dimensional shape structure between the first substrate contact portion and the second substrate contact portion, without contacting the first side of the substrate.

7. The antenna device in accordance with claim 5, wherein the antenna structure is arranged in the center on the three-dimensional shape structure, wherein a distance $D_1$ between the antenna structure and the first substrate contact portion comprises the same size as a distance $D_2$ between the antenna structure and the second substrate contact portion.

8. The antenna device in accordance with claim 1, wherein the three-dimensional shape structure comprises a dielectric, and/or wherein the three-dimensional shape structure is produced from the same material as is the substrate, and/or wherein the three-dimensional shape structure and the substrate are formed integrally.

9. The antenna device in accordance with claim 1, wherein a first portion of the antenna feed line is arranged on the three-dimensional shape structure and a second portion of the antenna feed line is arranged on the first side of the substrate.

10. The antenna device in accordance with claim 1, wherein the first side of the substrate comprises a metallization sheet separated galvanically from the antenna feed line, the metallization sheet extending over at least 95% of the entire first side of the substrate, or the metallization sheet extending at least between the substrate and the three-dimensional shape structure.

11. The antenna device in accordance with claim 10, wherein the three-dimensional shape structure is arranged on the metallization sheet and isolates the antenna structure galvanically from the metallization sheet.

12. The antenna device in accordance with claim 1, wherein the at least one portion of the three-dimensional shape structure where the antenna structure is arranged, is spaced apart from the first side of the substrate, wherein a measure $H_1$, $H_2$ of the spacing between the first side of the substrate and the antenna structure arranged on the portion of the three-dimensional shape structure is a half $\lambda/2$ of or a quarter $\lambda/4$ of a resonant wavelength of the antenna structure.

13. The antenna device in accordance with claim 1, wherein the at least one portion of the three-dimensional shape structure where the antenna structure is arranged, is spaced apart from the first side of the substrate in a contactless manner, and wherein a gap between the portion of the three-dimensional shape structure and the first side of the substrate comprises a dielectric.

14. The antenna device in accordance with claim 13, wherein the three-dimensional shape structure protrudes into the gap and fills at least one fourth of, or at least a half of, or at least three quarters of the gap.

15. The antenna device in accordance with claim 1, wherein the antenna structure extends in a plane parallel to the substrate plane or in a plane not extending in parallel relative to the substrate plane.

16. The antenna device in accordance with claim 1, wherein the antenna structure is a monopole, a dipole, a folded dipole or a meandering radiator.

17. The antenna device in accordance with claim 1, wherein the antenna structure comprises at least a geometrical structure which influences the electrical characteristic of the antenna structure, in particular its polarization, bandwidth, resonant frequency, efficiency and gain.

18. The antenna device in accordance with claim 1, wherein the antenna structure comprises at least one slot.

19. The antenna device in accordance with claim 1, wherein the antenna device is implemented as an array which comprises at least two antenna structures.

20. An electrical device comprising a multi-layered substrate comprising a high-frequency circuit, and an antenna device in accordance with claim 1, wherein the antenna device is arranged at the multi-layered substrate and is coupled to the high-frequency circuit, and wherein the antenna device is implemented to emit a high-frequency signal of the high-frequency circuit and/or receive a high-frequency signal and provide the same to the high-frequency circuit.

* * * * *